United States Patent
Forejt

(10) Patent No.: US 7,733,179 B2
(45) Date of Patent: Jun. 8, 2010

(54) COMBINATION TRIM AND CMFB CIRCUIT AND METHOD FOR DIFFERENTIAL AMPLIFIERS

(75) Inventor: Brett E. Forejt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 12/288,481

(22) Filed: Oct. 21, 2008

(65) Prior Publication Data

US 2009/0108936 A1    Apr. 30, 2009

Related U.S. Application Data

(60) Provisional application No. 60/984,200, filed on Oct. 31, 2007.

(51) Int. Cl.
*H03F 3/45* (2006.01)
(52) U.S. Cl. .................. 330/258; 330/9; 330/253
(58) Field of Classification Search .......... 330/258, 330/9, 253
See application file for complete search history.

(56) References Cited

U.S. PATENT DOCUMENTS

| | | | | |
|---|---|---|---|---|
| 5,936,469 A | * | 8/1999 | Alexander et al. | 330/258 |
| 6,278,321 B1 | * | 8/2001 | Franck | 330/254 |
| 6,798,293 B2 | * | 9/2004 | Casper et al. | 330/258 |
| 7,389,097 B2 | * | 6/2008 | Tamura | 455/280 |
| 7,489,186 B2 | * | 2/2009 | Segarra | 330/2 |
| 7,592,867 B2 | * | 9/2009 | Trifonov et al. | 330/253 |

OTHER PUBLICATIONS

"Fully Differential Operational Amplifiers with Accurate Output Balancing" by M. Banu, J. Khoury and Y. Tsividis, IEEE Journal of Solid-State Circuits, vol. 23, No. 6, Dec. 1988, pp. 1410-1414.

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

A differential amplifier (10-1,2) includes an input stage (7) including first (M1) and second (M2) input transistors and first (4A) and second (4B) load devices. Sources of the first and second input transistors are connected together. Drains of the first and second input transistors are coupled by first (12) and second (13) conductors to the first and second load devices, respectively. Common mode feedback circuitry (6A) including first (M3), second (M4), and third (M5) transistors is combined with offset correction circuitry (8) including the second transistor and the third transistor. Sources of the first, second, and third transistors are coupled to a tail current source (11). Drains of the second and third transistors are coupled to the first and second conductors, respectively. A common mode voltage ($V_{OCM}$) is applied to a gate of the first transistor. Offset trim voltages are applied to gates of the second and third transistors.

19 Claims, 3 Drawing Sheets

COMBINATION TRIM AND CMFB CIRCUIT AND METHOD FOR DIFFERENTIAL AMPLIFIERS

CROSS REFERENCE TO RELATED APPLICATION

This application claims the benefit of prior filed co-pending U.S. provisional application Ser. No. 60/984,200 filed Oct. 31, 2007, entitled "COMBINATION TRIM & CMFB CIRCUIT FOR DIFFERENTIAL AMPLIFIERS", by Brett Forejt, and incorporated herein by reference.

BACKGROUND OF THE INVENTION

The present invention relates generally to integrated circuit differential amplifiers having high speed common mode feedback and also having programmable input offset trim capability, and more particularly to improvements which result in substantially reduced circuit complexity and substantially reduced noise levels.

In the prior art, there are several ways to accomplish input offset compensation, for example by trimming or calibrating load devices of the input stage or by injecting an offset compensation current into the circuit nodes between drains of the input transistors and their corresponding load devices. These input offset compensation techniques require an additional differential input transistor pair and associated tail current source and also require a trim voltage generator circuit, and are characterized by undesirably high noise levels and undesirably high circuit complexity.

"Prior Art" FIG. 1 shows a "conceptual" diagram of a differential amplifier 1 including an input stage 7 which includes input transistor pair 2, associated load devices 4, and a current source 7. Control electrodes of the input transistors in block 2 receive input signals $Vin^+$ and $Vin^-$. Current source 3 provides tail current for the common sources (or common emitters) of the input transistors in block 2. Block 4 includes load devices (e.g., load resistors or current sources) which are connected to drains (or collectors) of the input transistors in block 2. A common mode feedback circuit 6 is coupled to input stage 7 by means of any one of the circuit paths labeled Path A, Path B, or Path C to adjust corresponding common mode feedback points. Offset trim circuit 5 is coupled to input stage 7 by either Path D or Path E. The prior art techniques indicated in FIG. 1 also can be used in "ultra low voltage" differential amplifier designs which do not include tail current source 3. Various implementations of the individual blocks in FIG. 1 are known in the prior art.

The common mode feedback using Path A can be used to control tail current source 3 dynamically to adjust the common mode voltage level that occurs on the conductors connected between input transistor pair 2 and load devices 4. Alternatively, common mode feedback Path B directly adjusts or modulates the impedance of the load circuit in block 4 in order to adjust the common mode voltage level on the conductors connected between the individual load devices in block 4 and the drains (or collectors) of the input transistors in block 2. Alternatively, common mode feedback Path C can be used to adjust the common mode voltage level on the conductors connected between the individual load devices in block 4 and the corresponding input transistors in block 2 by injecting a common mode feedback current directly into those same conductors.

Input offset trim circuit 5 can use Path D in FIG. 1 to modulate the differential impedance of load devices 4 by injecting a constant differential current into the conductors connected between the load devices in block 4 and the drains (or collectors) of the corresponding input transistors in block 2.

Referring to "Prior Art" FIG. 2, offset trim generator circuit 5 of FIG. 1 receives a reference voltage $V_{REF}$ that is applied to the (+) input of a buffer amplifier 20. The output of buffer amplifier 20 is connected by conductor 19 to its (−) input and also to one terminal of a resistor 18, the other terminal of which is connected to the input of a current mirror 21. The output of current mirror 21 flows through an adjustable-resistance or tappable-resistance circuit 17A,B which is connected between $V_{DD}$ and the output of current mirror 21. An upper trim voltage $V_{TRIM}^+$ is produced on a tap point of adjustable-resistance circuit 17A,B, and a lower trim voltage $V_{TRIM}^-$ is produced on another tap point of adjustable-resistance circuit 17A,B, or alternatively, on the output conductor 19 of buffer amplifier 20. Trim voltages $V_{TRIM}^+$ and $V_{TRIM}^-$ can be used along Path E in FIG. 1, or they can be applied to the inputs of a buffer circuit (not shown) in Path D, in which case the outputs of the buffer circuit can be applied to the nodes between input transistor pair 2 and load devices 4.

Common mode feedback circuit 6 of FIG. 1 can be implemented in various ways, for example as indicated in the article "Fully Differential Operational Amplifiers with Accurate Output Balancing" by M. Banu, J. Khoury, and Y. Tsividis, IEEE Journal of Solid-State Circuits, Volume 23, Number 6, December 1988, pp. 1410-1414. This article discloses several known common mode feedback circuits for differential amplifiers.

The prior art differential amplifiers having both high speed common mode feedback and programmable input offset trim capability require undesirably complex circuitry and an undesirably large amount of integrated circuit chip area, and are characterized by undesirably high noise levels associated with the connections of the common mode feedback circuitry and offset trim generators to the amplifier input stage and by undesirably high power consumption.

Thus, there is an unmet need in the prior art for a differential amplifier having both high speed common mode feedback and programmable input offset trim capability and which has less complex circuitry than the closest prior art.

There also is an unmet need in the prior art for a differential amplifier having both high speed common mode feedback and programmable input offset trim capability and which has lower noise than the closest prior art.

There also is an unmet need in the prior art for a differential amplifier having both high speed common mode feedback and programmable input offset trim capability and which has substantially less complex circuitry and substantially lower noise then the closest prior art.

There also is an unmet need in the prior art for a differential amplifier having both high speed common mode feedback and programmable input offset trim capability and which has lower power dissipation than the closest prior art.

There also is an unmet need in the prior art for a differential amplifier having both high speed common mode feedback and programmable input offset trim capability and which requires less integrated circuit chip area than the closest prior art.

SUMMARY OF THE INVENTION

It is an object of the invention to provide a differential amplifier having both high speed common mode feedback and programmable input offset trim capability and which has less complex circuitry than the closest prior art.

It is another object of the invention to provide a differential amplifier having both high speed common mode feedback and programmable input offset trim capability and which has lower noise than the closest prior art.

It is another object of the invention to provide a differential amplifier having both high speed common mode feedback and programmable input offset trim capability and which has substantially less complex circuitry and substantially lower noise than the closest prior art.

It is another object of the invention to provide a differential amplifier having both high speed common mode feedback and programmable input offset trim capability and which requires less integrated circuit chip area and which also reduces power consumption, while also providing increased speed and improved noise performance of the differential amplifier.

Briefly described, and in accordance with one embodiment, the present invention provides a differential amplifier (10-1,2) including an input stage (7) having first (M1) and second (M2) input transistors and first (4A) and second (4B) load devices. First electrodes of the first and second input transistors are connected together. The second electrodes of the first and second input transistors are coupled by first (12) and second (13) conductors to the first and second load devices, respectively. Common mode feedback circuitry (6A) including first (M3), second (M4), and third (M5) transistors is combined with offset correction circuitry (8) including the second transistor and the third transistor. First electrodes of the first, second, and third transistors are coupled to a tail current source (11). Second electrodes of the second and third transistors are coupled to the first and second conductors, respectively. A common mode voltage ($V_{OCM}$) is applied to a control electrode of the first transistor. Offset trim voltages are applied to the control electrodes of the second and third transistors.

In one embodiment, the invention provides a differential amplifier including an input stage (7) having first (M1) and second (M2) input transistors and first (4A) and second (4B) load devices. Each of the first (M1) and second (M2) input transistors includes a control electrode and first and second electrodes. The first electrodes of the first (M1) and second (M2) input transistors are connected together. The second electrode of the first input transistor (M1) is coupled by a first conductor (12) to a terminal of the first load device (4A). The second electrode of the second input transistor (M2) is coupled by a second conductor (13) to a terminal of the second load device (4B). A combined CMFB (common mode feedback) and offset correction circuit (8) includes an offset correction section (5A) and a CMFB section (6A). The CMFB section (6A) includes first (M3), second (M4) and third (M5) transistors each having a control electrode and first and second electrodes. The first electrodes of the first (M3) and second (M4) transistors are connected together by a third conductor (14). The second electrode of the first transistor (M3) is coupled to a first reference voltage ($V_{DD}$ in FIG. 3, GND in FIG. 4). The second electrode of the second transistor (M4) is coupled to the first conductor (12). A common mode output reference voltage ($V_{OCM}$) is provided on the control electrode of the first transistor (M3). The offset correction section (5A) includes an offset generator circuit (5) and the third transistor (M5). A first output (15) of the offset generator circuit (5) is coupled to a control electrode of the third transistor (M5). A first electrode of the third transistor (M5) is coupled to the third conductor (14). A second electrode of the third transistor (M5) is coupled to the second conductor (13). A second output (19) of the offset generator circuit (5) is coupled to the control electrode of the second transistor (M4).

The third conductor (14) is coupled by the first tail current source (11) to the first reference voltage ($V_{DD}$ in FIG. 3, GND in FIG. 4).

In a described embodiment, a tail current source (3) is coupled between the first electrodes of the first (M1) and second (M2) input transistors and a second reference voltage (GND). In a described embodiment, the first (M1) and second (M2) input transistors and the first (M3), second (M4) and third (M5) transistors are field effect transistors, wherein the control electrodes are gates, the first electrodes are sources, and the second electrodes are drains.

In one embodiment, the input stage (7) is a first stage of the differential amplifier, the differential amplifier further including a second stage (9) including first (29) and second (30) amplifiers, an input of each of the first (29) and second (30) amplifiers being coupled to the first (12) and second (13) conductors, respectively, an output of each of the first (29) and second (30) amplifiers being coupled to the gate of the first transistor (M3) so as to produce the common mode output reference voltage ($V_{OCM}$) on the gate of the first transistor (M3). The outputs of each of the first (29) and second (30) amplifiers are coupled by means of equal resistors (26,27) to the gate of the first transistor (M3).

In a described embodiment, the offset generator circuit (5) includes a string resistor circuit (17) coupled between a second reference voltage (GND) and a reference current source (21) and a plurality of switches (SW0,1,2 ... (N−2),(N−1)) coupled between a plurality of tap points (37-0,1,2 ... (N−2), 37-(N−1)), respectively, and the first output (15) of the offset generator circuit (5), and a trim voltage selector circuit (32) having a plurality of outputs (34) coupled to control electrodes of the switches (SW0,1,2 ... (N−2),(N−1)), respectively. The trim voltage selector circuit (32) includes a digital decoder circuit having an input coupled to receive a plurality of bits of a digital trim word (TRIM) and a plurality of outputs coupled to the outputs (34) of the trim voltage selector circuit (32).

In one embodiment, the invention provides a method for providing input offset correction and common mode feedback in a differential amplifier (10-1,2), including providing an input stage (7) including first (M1) and second (M2) input transistors and first (4A) and second (4B) load devices, each of the first (M1) and second (M2) input transistors including a control electrode and first and second electrodes, the first electrodes of the first (M1) and second (M2) input transistors being coupled together, the second electrode of the first input transistor (M1) being coupled by a first conductor (12) to a terminal of the first load device (4A), the second electrode of the second input transistor (M2) being coupled by a second conductor (13) to a terminal of the second load device (4B), the method including combining CMFB (common mode feedback) circuitry (6A) including first (M3), second (M4), and third (M5) transistors with offset correction circuitry (8,8A) including the second transistor (M4) and the third transistor (M5) and an offset generator circuit (5), each of the first (M3), second (M4), and third (M5) transistors having a control electrode and first and second electrodes, by coupling the first electrodes of the first (M3), second (M4), and third (M5) transistors to a third conductor (14) that is coupled to a first tail current source (11), coupling the second electrodes of the second (M4) and third (M5) transistors to the first (12) and second (13) conductors, respectively, applying a common mode output reference voltage ($V_{OCM}$) to the control electrode of the first transistor (M3), and applying first ($V_{TRIM}^+$) and second ($V_{TRIM}^-$) trim voltages to the control electrodes of the third (M5) and second (M4) transistors, respectively. In one embodiment, the method includes coupling a second tail current source (3) between the first electrodes of the first (M1) and second (M2) input transistors and a reference voltage (GND). In one embodiment, the method includes coupling a string resistor circuit (17) between the reference voltage (GND) and a reference current source (21), coupling a plurality of switches (SW0,1,2 ... (N−2),(N−1)) between a plurality of tap points (37-0,1,2 ... (N−2),37-(N−1)) of the string resistor circuit (17), respectively, and a fourth conductor (15), and decoding a digital trim word (TRIM) to select a desired tap point in order to produce the first trim voltage ($V_{TRIM}^+$) on the fourth conductor (15).

In one embodiment, the invention provides circuitry for providing input offset correction and common mode feedback in a differential amplifier (10-1,2), including an input stage (7) including first (M1) and second (M2) input transistors and first (4A) and second (4B) load devices, each of the first (M1) and second (M2) input transistors including a control electrode and first and second electrodes, the first electrodes of the first (M1) and second (M2) input transistors being connected together, the second electrode of the first input transistor (M1) being coupled by a first conductor (12) to a terminal of the first load device (4A), the second electrode of the second input transistor (M2) being coupled by a second conductor (13) to a terminal of the second load device (4B), and means (8,8A) for combining CMFB (common mode feedback) circuitry (6A) including first (M3), second (M4), and third (MS) transistors with offset correction circuitry (8,8A) including the second transistor (M4) and the third transistor (M5) and an offset generator circuit (5), each of the first (M3), second (M4), and third (M5) transistors having a control electrode and first and second electrodes, including means for coupling the first electrodes of the first (M1), second (M2), and third (M3) transistors to a third conductor (14) that is coupled to a tail current source (11), and means for coupling the second electrodes of the second (M4) and third (MS) transistors to the first (12) and second (13) conductors, respectively, means for applying a common mode output reference voltage ($V_{OCM}$) to the control electrode of the first transistor (M3), and means (5) for applying first ($V_{TRIM}^+$) and second ($V_{TRIM}^-$) trim voltages to the control electrodes of the third (MS) and second (M4) transistors, respectively.

DETAILED DESCRIPTION OF THE PREFERRED EMBODIMENTS

Figure 1:
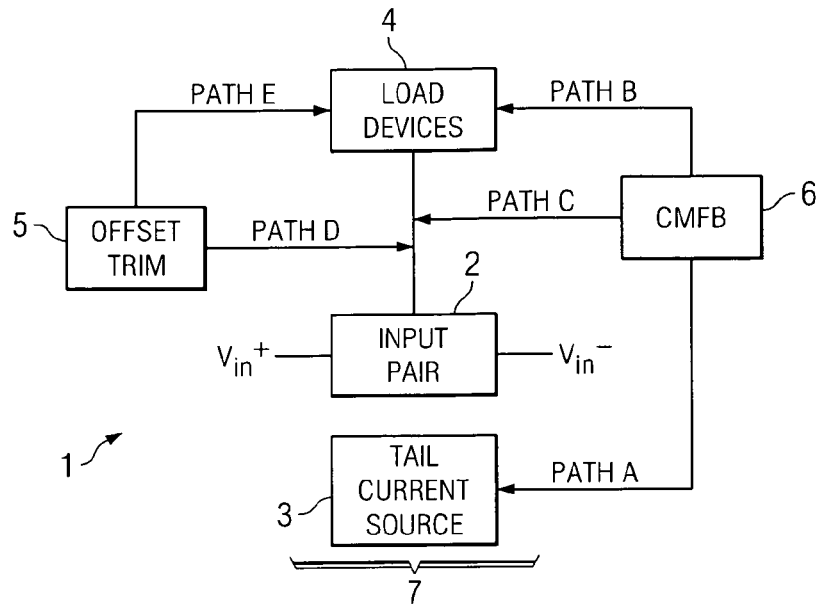
FIG. 1 is a generalized block diagram representing several configurations of various prior art differential amplifiers having various common mode feedback circuit connections and various programmable offset trim circuit connections.
Figure 3:
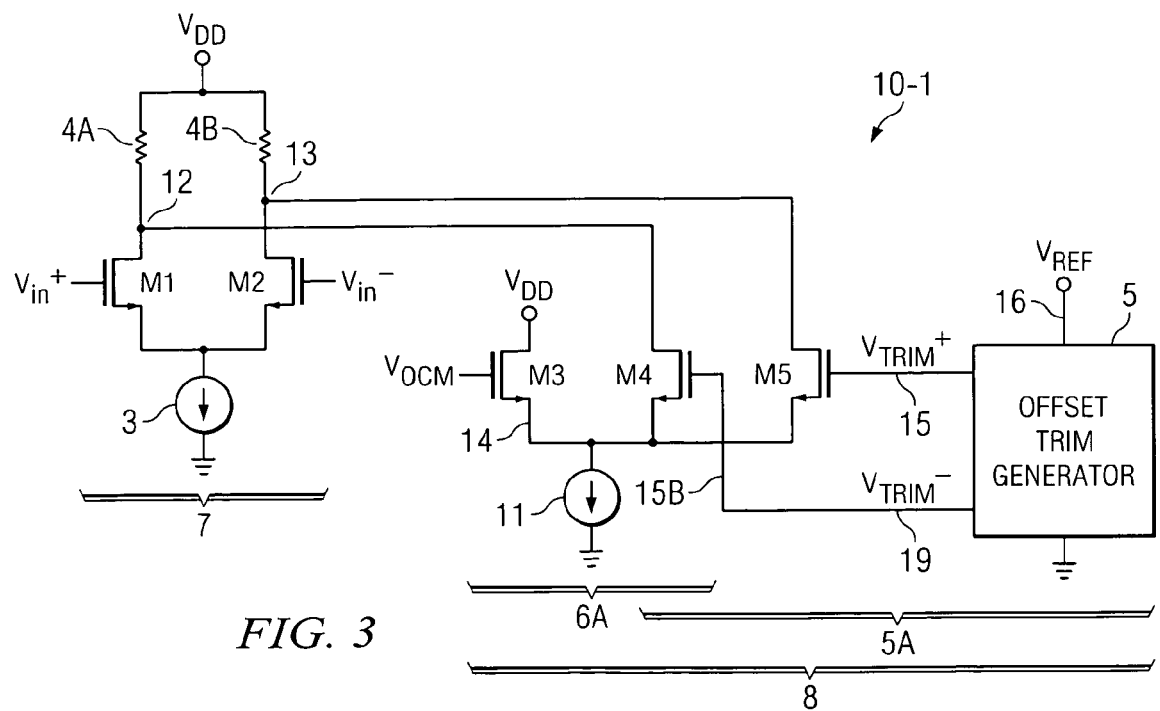
FIG. 3 is a schematic diagram of one embodiment of the differential amplifier of the present invention.
Figure 2:
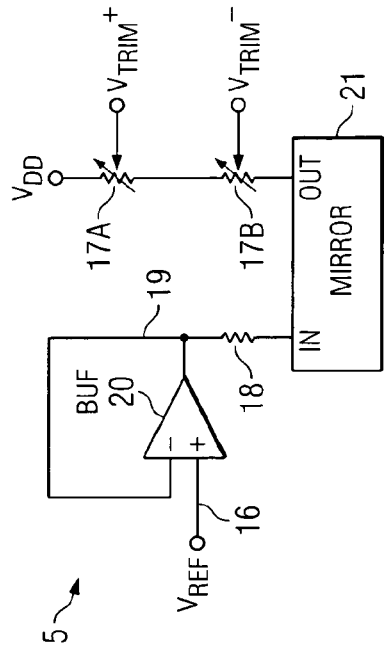
FIG. 2 is a conceptual diagram of a conventional circuit for creating a voltage needed for trimming the offset voltage of a differential amplifier.

Referring to FIG. 3, single-stage differential amplifier 10-1 includes an input stage 7 including N-channel input transistors M1 and M2 having their sources connected to a tail current source 3. The gates of input transistors M1 and M2 are coupled to Vin$^+$ and Vin$^-$, respectively. The drain of input transistor M1 is connected by conductor 12 to one terminal of load resistor 4A, and the drain of input transistor M2 is connected by conductor 13 to one terminal of load resistor 4B. The upper terminals of load resistors 4A and 4B are connected to supply voltage $V_{DD}$.

In accordance with the present invention, single-stage differential amplifier 10-1 also includes a combined common mode feedback and input offset adjustment circuit 8 (referred to herein as "combined CMFB and offset adjustment circuit 8"). Combined CMFB and offset adjustment circuit 8 includes an input offset adjustment section 5A and a common mode feedback section 6A. Conductor 12 is connected to the drain of N-channel transistor M4, which is included in both offset adjustment section 5A and common mode feedback section 6A. Conductor 13 is connected to the drain of N-channel transistor M5 which is included in both offset adjustment section 5A and common mode feedback section 6A. Common mode feedback section 6A includes a P-channel transistor M3, the source of which is connected by conductor 14 to a tail current source 11 and the sources of transistors M4 and M5.

The gate of transistor M3 is coupled to an output common mode voltage $V_{OCM}$, which is a reference voltage that is provided for amplifier 10-1. The gate of transistor M4 is connected by conductor 19 to receive a trim voltage $V_{TRIM}^-$ produced by offset trim voltage generator circuit 5 of input offset adjustment section 5A. The gate of transistor M5 is connected by conductor 15 to receive another trim voltage $V_{TRIM}^+$ produced by offset trim voltage generator circuit 5. Offset trim voltage generator circuit 5 is coupled between reference voltage $V_{REF}$ and ground.

Combining the two functions of input offset correction and common mode feedback into a single functional circuit in accordance with the present invention results in use of fewer noise-generating circuit elements, and the result has been found to be an almost negligible level of noise generation. Combining the two functions of input offset correction and common mode feedback into a single functional circuit in accordance with the present invention also results in reduced power consumption, reduced circuit complexity, and reduced amounts of required integrated circuit chip area.

Figure 4:
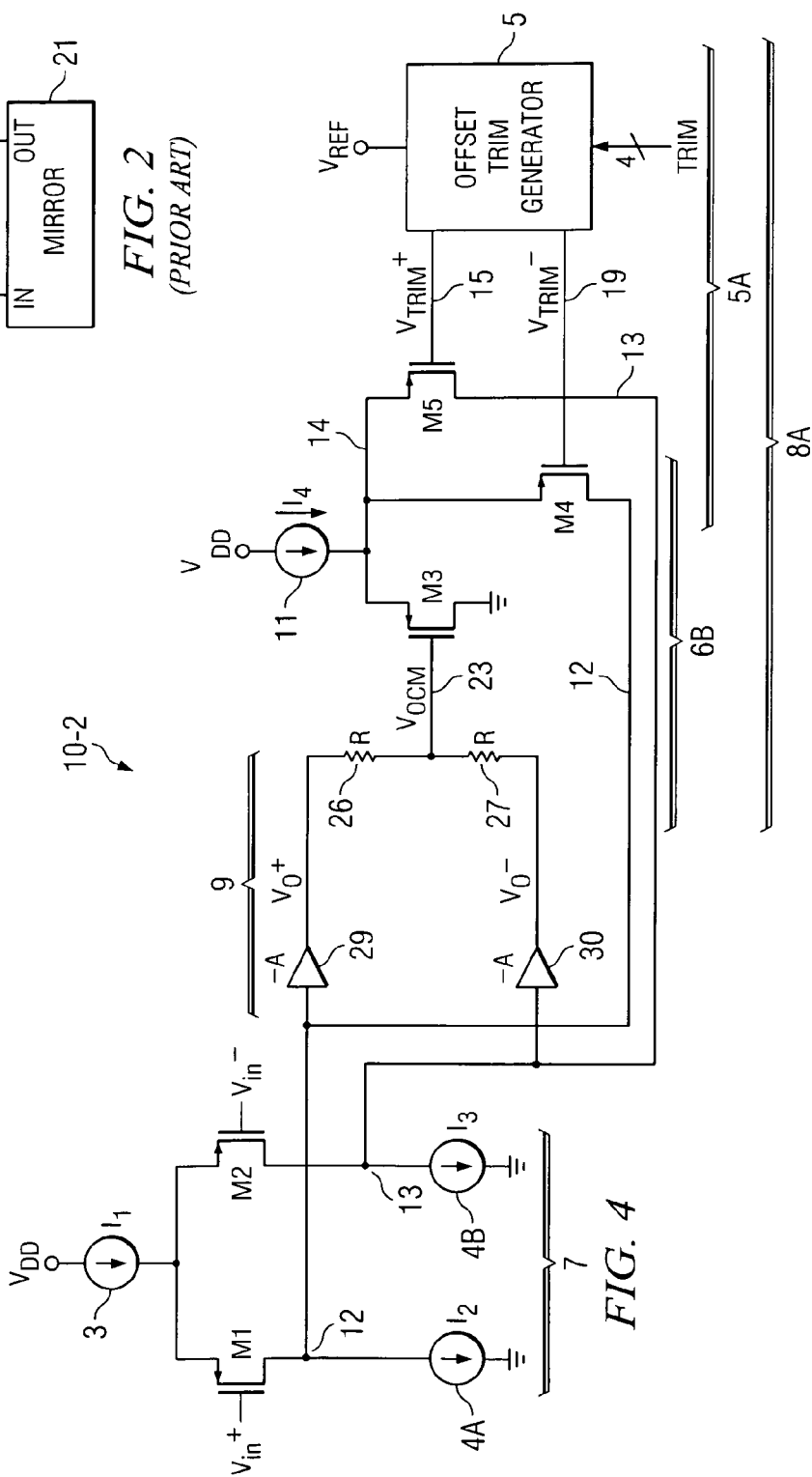
FIG. 4 is a schematic diagram of another embodiment of the present invention.

The differential amplifier of the present invention may include only a single stage as shown in above described FIG. 3, but it may also include one (or more) additional stages as indicated in FIG. 4. Referring to FIG. 4, a 2-stage differential amplifier 10-2 (which is similar to 1-stage differential amplifier 10-1 of FIG. 3) includes an input stage 7 that includes P-channel input transistors M1 and M2. The sources of input transistors M1 and M2 are connected to tail current source 3. The gates of input transistors M1 and M2 are coupled to Vin$^+$ and Vin$^-$, respectively. The drain of input transistor M1 is connected by conductor 12 to one terminal of a current source 4A, and the drain of input transistor M2 is connected by conductor 13 to one terminal of current source 4B. The lower terminals of current sources 4A and 4B are connected to ground, so they function as load devices for input transistors M1 and M2, respectively.

Conductor 12 is connected to the input of an inverting amplifier 29, the output Vo$^+$ of which is coupled by a resistor 26 to a conductor 23. Similarly, conductor 13 is connected to the input of an inverting amplifier 30, the output Vo$^-$ of which is coupled by a resistor 27 to conductor 23. (Note that a non-inverting single stage amplifier usually does not have much gain. The most common non-inverting single stage amplifier is a source follower (or emitter follower) which has a gain of approximately 1, whereas the most common single stage inverting amplifier is a common source (or common emitter) amplifier, which typically has a gain of −50 to −500.

The simplest topology for implementing a high-gain amplifier therefore usually is an inverting amplifier stage.) A common mode output voltage $V_{OCM}$ is produced on conductor 23. The resistances R of resistors 26 and 27 are equal, so the voltage at the junction 23 between resistors 26 and 27 is applied to the gate of transistor M3, and is equal to the average of the output voltages Vo+ and Vo− of amplifiers 29 and 30, respectively. This average voltage is the common mode voltage $V_{OCM}$. Amplifiers 29 and 30 and resistors 26 and 27 form a second stage 9 of two-stage differential amplifier 10-2. The differential output signal of two-stage differential amplifier 10-2 is Vo+−Vo−, and resistors 26 and 27 form a common mode reference voltage circuit that generates $V_{OCM}$.

In FIG. 4, combined CMFB and offset adjustment circuit 8A includes offset adjustment section 5A and common mode feedback section 6B. Offset adjustment section 5A includes transistors M4 and M5 and offset trim generator 5. Common mode feedback section 6B includes transistors M3, M4 and M5 as in FIG. 3 and further includes the common mode reference voltage generating circuit including resistors 26 and 27. Conductor 12 is connected to the drain of P-channel transistor M4, which functions as a part of both offset adjustment section 5A and common mode feedback section 6B. Similarly, conductor 13 is connected to the drain of P-channel transistor M5, which functions as a part of offset adjustment section 5A and common mode feedback section 6B.

Common mode feedback section 6B in FIG. 4 includes P-channel transistor M3, the source of which is connected by conductor 14 to tail current source 11 and the sources of P-channel transistors M4 and M5. The upper terminal of tail current source 11 is connected to $V_{DD}$. The gate of transistor M3 is coupled to the output common mode voltage $V_{OCM}$ generated by amplifiers 29 and 30 and resistors 26 and 27. The gate of transistor M4 is connected by conductor 19 to receive the trim voltage $V_{TRIM}^-$ produced by offset trim voltage generator circuit 5. The gate of transistor M5 is connected by conductor 15 to receive the trim voltage $V_{TRIM}^+$ produced by an offset trim voltage generator circuit 5. Offset trim voltage generator circuit 5 is coupled to receive a reference voltage $V_{REF}$ and to receive a four-bit digital input offset adjustment word TRIM on digital bus 22.

Figure 5:
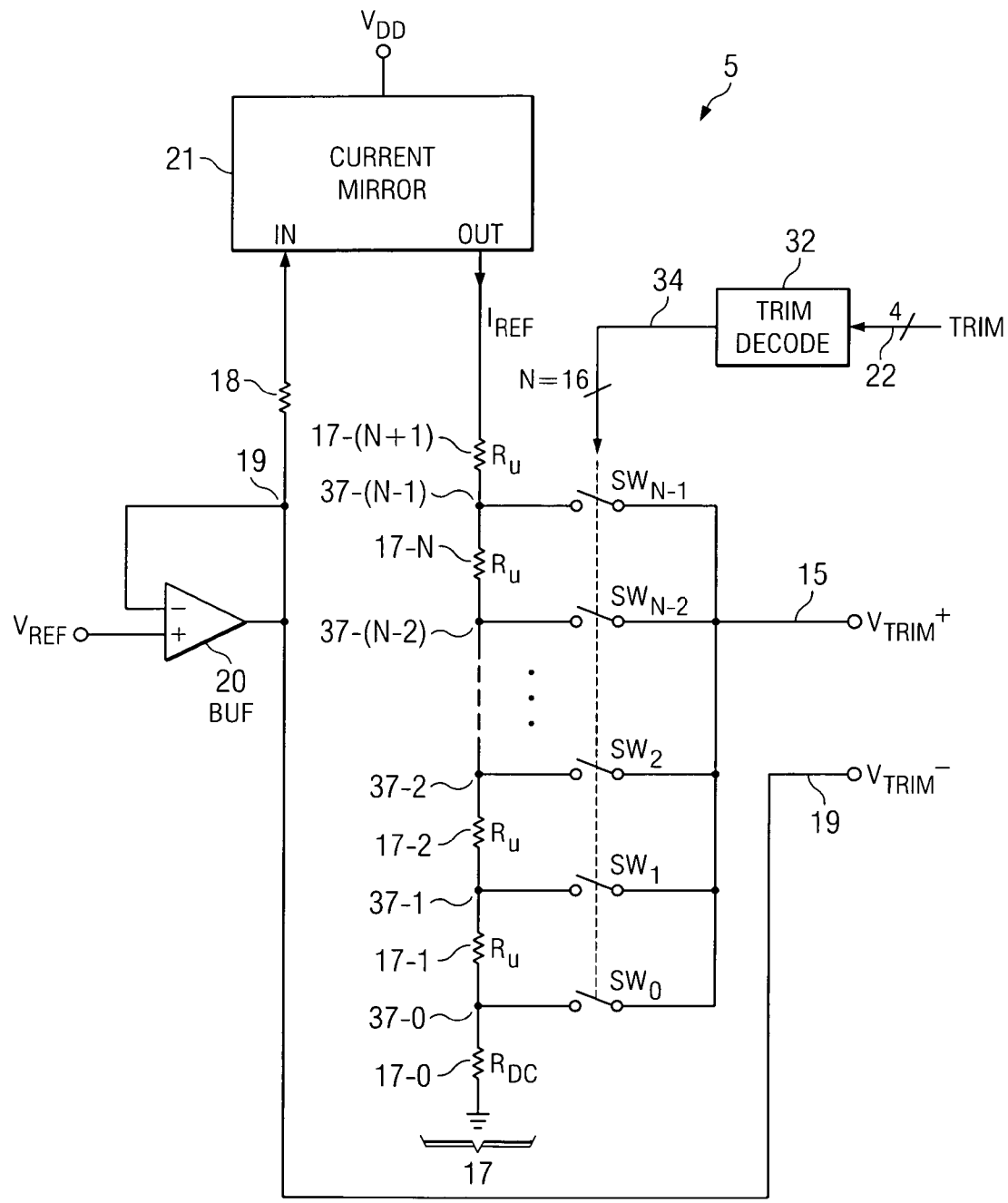
FIG. 5 is a detailed schematic diagram of the circuit of FIG. 2.

Referring to FIG. 5, digitally programmable offset trim generator 5 shown in FIGS. 3 and 4 generates the programmable trim voltage $V_{TRIM}^+$ and hence the programmable voltage difference $V_{TRIM}^+ - V_{TRIM}^-$, in response to both $V_{REF}$ and the four-bit digital word TRIM. The reference voltage $V_{REF}$ is applied to the (+) input of buffer amplifier 20. The output of buffer amplifier 20 is connected by conductor 19 to the (−) input of buffer amplifier 20 and also to one terminal of resistor 18, the other terminal of which is connected to the input of current mirror 21. The output current $I_{REF}$ of current mirror 21 flows into the upper terminal of a resistor string 17 which is composed of a DC offset resistor 17-0 of resistance $R_{DC}$ and series-connected unit resistors 17-1,2 . . . N, each having a resistance Ru. In this example, N is equal to 16, which is the number of switch control conductors 34 generated at the output of a trim decoder circuit 32 that decodes the 16 states of 4-bit digital trim word TRIM on bus 22. Switch control circuit 32 can be implemented by means of various conventional decoders.

The various tap points 37-0,1,2 . . . (N−1) each are connected to one terminal of a switch SW0,1,2 . . . (N−1), respectively. The other terminal of each switch is connected to the conductor 15 on which the upper trim voltage $V_{TRIM}^+$ is produced. Therefore, the higher voltage $V_{TRIM}^+$ on conductor 15 has a value dependent on the values of both digital trim word TRIM and reference voltage $V_{REF}$. The lower trim voltage $V_{TRIM}^-$ is produced on conductor 19 by buffer amplifier 20. A selected tap point of resistor string 17 is selectively coupled by one of the switches SW0,1,2 . . . (N−1) to conductor 15 on which an upper trim voltage $V_{TRIM}^+$ is produced.

Resistor 17-0 establishes an initial DC offset voltage. Any intermediate circuit node 37-0, 1, 2 . . . (N−1) between the various divider resistors of resistor string 17 can be selected by means of the corresponding switches to provide monotonic, evenly spaced corresponding values of trim voltage $V_{TRIM}^+$ on conductor 15. In the example of FIG. 5, 4 bits of TRIM on bus 22 are decoded by trim decode circuit 32 to select one of 16 possible values of $V_{TRIM}^+$. The value of the trim voltage $V_{TRIM}^-$ is equal to $V_{REF}$ which, for example, can be a value between about 1.35 to 2.75 volts. The value of the trim voltage therefore is equal to $V_{REF} \pm$ the value of $V_{TRIM}^+$, (which can be ±8 millivolts). (Note that these voltage values are just examples, and can be scaled according to any particular design need.) The two voltages $V_{TRIM}^+$ and $V_{TRIM}^-$ are applied to the gates of transistors M5 and M4, respectively, in FIG. 4, the drains of which inject the desired amount of differential input offset compensation current into conductors 12 and 13. Transistors M4 and M5 also inject the desired CMFB control current into conductors 12 and 13.

In contrast to the prior art in which completely separate and independent circuits are utilized to perform the common mode feedback function and the input offset trim function, the present invention combines the input offset trim circuitry in the common mode feedback circuitry in such a way as to provide a single CMFB and input offset compensation circuit that reduces the number of connections to the amplifier input stage, substantially reduces the noise level therein while maintaining high speed CMFB operation, and reduces the power consumption. The combined input offset trim circuitry and common mode feedback circuitry also results in higher circuit operating speeds due to reduced parasitic components resulting from the lower number of circuit connections. The reduced circuit complexity results in less required integrated circuit chip area and hence lower cost.

Thus, the present invention combines a prior offset trim circuit and technique and a prior common mode feedback technique in a new simpler, lower noise differential amplifier that provides high speed common mode feedback and also provides programmable input offset voltage trim capability, but without the additional circuit loops required by the prior art and without the substantially higher noise levels, higher power consumption, higher integrated circuit chip area, and lower circuit operating speed due to more parasitic components that are characteristic of the prior art.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, there are various other ways to generate the circuit function of the preferred implementation shown in FIG. 5 to generate a monotonically increasing differential voltage. Although the described embodiments of the invention utilize field effect transistors, the invention is equally applicable to differential amplifier designs which utilize bipolar transistors. Furthermore, the techniques indicated in FIGS. 3 and 4 can be utilized in "ultra low voltage" differential amplifier designs which do not include the tail current source 3 in FIGS. 3 and 4. Also, there are various other ways of generating the reference current $I_{REF}$, for example by means of a master current source circuit elsewhere on the same integrated circuit chip. Other kinds of first stages can be used, such as stages including folded cascode, telescopic, or "ultra-low" voltage can be used. Also, the conductivity type of the transistors M1 and M2 in input stage 7 can be different than the conductivity type of the transistors M3, M4, and M5.

What is claimed is:

1. A differential amplifier comprising:
   (a) an input stage including first and second input transistors and first and second load devices, each of the first and second input transistors including a control electrode and first and second electrodes, the first electrodes of the first and second input transistors being coupled together, the second electrode of the first input transistor being coupled by a first conductor to a terminal of the first load device, the second electrode of the second input transistor being coupled by a second conductor to a terminal of the second load device; and
   (b) a combined CMFB (common mode feedback) and offset correction circuit including an offset correction section and a CMFB section,
      the CMFB section including first, second and third transistors each including a control electrode and first and second electrodes, the first electrodes of the first and second transistors being coupled together by a third conductor, the second electrode of the first transistor being coupled to a first reference voltage, the second electrode of the second transistor being coupled to the first conductor, a common mode output reference voltage being provided on the control electrode of the first transistor,
      the offset correction section including an offset generator circuit and the third transistor, a first output of the offset generator circuit being coupled to a control electrode of the third transistor, a first electrode of the third transistor being coupled to the third conductor, a second electrode of the third transistor being coupled to the second conductor, a second output of the offset generator circuit being coupled to the control electrode of the second transistor; and
      the third conductor being coupled by the first tail current source to a second reference voltage.

2. The differential amplifier of claim 1 including a first tail current source coupled between the first electrodes of the first and second input transistors and a second reference voltage.

3. The differential amplifier of claim 2 wherein the first and second input transistors and the first, second and third transistors are field effect transistors, wherein the control electrodes are gates, the first electrodes are sources, and the second electrodes are drains.

4. The differential amplifier of claim 3 wherein the first and second input transistors and the first, second and third transistors are MOS transistors.

5. The differential amplifier of claim 3 wherein the first and second load devices are current sources.

6. The differential amplifier of claim 3 wherein the first and second load devices are resistors.

7. The differential amplifier of claim 3 wherein the input stage is a first stage of the differential amplifier, the differential amplifier further including a second stage including first and second amplifiers, an input of each of the first and second amplifiers being coupled to the first and second conductors, respectively, an output of each of the first and second amplifiers being coupled to the gate of the first transistor so as to produce the common mode output reference voltage on the gate of the first transistor.

8. The differential amplifier of claim 7 wherein the outputs of each of the first and second amplifiers are coupled by means of equal resistors to the gate of the first transistor.

9. The differential amplifier of claim 1 wherein the offset generator circuit includes a string resistor circuit coupled between a second reference voltage and a reference current source and a plurality of switches coupled between a plurality of tap points, respectively, and the first output of the offset generator circuit, and a trim voltage selector circuit having a plurality of outputs coupled to control electrodes of the switches, respectively.

10. The differential amplifier of claim 9 wherein the trim voltage selector circuit includes a digital decoder circuit having an input coupled to receive a plurality of bits of a digital trim word and a plurality of outputs coupled to the outputs of the trim voltage selector circuit.

11. The differential amplifier of claim 9 wherein the resistor string includes a DC offset resistor coupled between the second reference voltage and a first tap point of the resistor string.

12. The differential amplifier of claim 4 wherein the first and second input transistors and the first, second and third transistors are of the same conductivity type.

13. The differential amplifier of claim 12 wherein the first and second input transistors and the first, second and third transistors are N-channel transistors.

14. The differential amplifier of claim 12 wherein the first and second input transistors and the first, second and third transistors are P-channel transistors.

15. A method for providing input offset correction and common mode feedback in a differential amplifier, the method comprising:
   (a) providing an input stage including first and second input transistors and first and second load devices, each of the first and second input transistors including a control electrode and first and second electrodes, the first electrodes of the first and second input transistors being connected together, the second electrode of the first input transistor being coupled by a first conductor to a terminal of the first load device, the second electrode of the second input transistor being coupled by a second conductor to a terminal of the second load device; and
   (b) combining CMFB (common mode feedback) circuitry including first, second, and third transistors with offset correction circuitry including the second transistor and the third transistor and an offset generator circuit, each of the first, second, and third transistors having a control electrode and first and second electrodes, by
      (1) coupling the first electrodes of the first, second, and third transistors to a third conductor that is coupled to a first tail current source, coupling the second electrodes of the second and third transistors to the first and second conductors, respectively,
      (2) applying a common mode output reference voltage to the control electrode of the first transistor, and
      (3) applying first and second trim voltages to the control electrodes of the third and second transistors, respectively.

16. The method of claim 15 including coupling a second tail current source between the first electrodes of the first and second input transistors and a reference voltage.

17. The method of claim 15 including coupling inputs of first and second amplifiers to the first and second conductors, and resistively coupling an output of each of the first and second amplifiers to the control electrode of the first transistor so as to produce the common mode output reference voltage on the control electrode of the first transistor.

18. The method of claim 15 including coupling a string resistor circuit between the reference voltage and a reference current source, coupling a plurality of switches between a plurality of tap points of the string resistor circuit, respectively, and a fourth conductor, and decoding a digital trim word to select a desired tap point in order to produce the first trim voltage on the fourth conductor.

19. Circuitry for providing input offset correction and common mode feedback in a differential amplifier, the circuitry comprising:

(a) an input stage including first and second input transistors and first and second load devices, each of the first and second input transistors including a control electrode and first and second electrodes, the first electrodes of the first and second input transistors being connected together, the second electrode of the first input transistor being coupled by a first conductor to a terminal of the first load device, the second electrode of the second input transistor being coupled by a second conductor to a terminal of the second load device; and (b) means for combining CMFB (common mode feedback) circuitry including first, second, and third transistors with offset correction circuitry including the second transistor and the third transistor and an offset generator circuit, each of the first, second, and third transistors having a control electrode and first and second electrodes, including (1) means for coupling the first electrodes of the first, second, and third transistors to a third conductor that is coupled to a tail current source, and means for coupling the second electrodes of the second and third transistors to the first and second conductors, respectively, (2) means for applying a common mode output reference voltage to the control electrode of the first transistor, and (3) means for applying first and second trim voltages to the control electrodes of the third and second transistors, respectively.

* * * * *